(12) United States Patent
Hess

(10) Patent No.: US 8,130,572 B2
(45) Date of Patent: Mar. 6, 2012

(54) LOW POWER MEMORY ARRAY COLUMN REDUNDANCY MECHANISM

(75) Inventor: Greg M. Hess, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 175 days.

(21) Appl. No.: 12/729,489

(22) Filed: Mar. 23, 2010

(65) Prior Publication Data

US 2011/0235447 A1 Sep. 29, 2011

(51) Int. Cl.
*G11C 29/00* (2006.01)

(52) U.S. Cl. ............... 365/200; 365/230.02; 365/189.02; 365/189.16

(58) Field of Classification Search .................. 365/200, 365/230.02, 189.02, 189.16
See application file for complete search history.

(56) References Cited

U.S. PATENT DOCUMENTS

| | | | |
|---|---|---|---|
| 4,982,365 A | 1/1991 | Ohtani | |
| 5,406,516 A * | 4/1995 | Ihara et al. | 365/189.16 |
| 5,623,450 A | 4/1997 | Phillips | |
| 5,848,018 A | 12/1998 | McClure | |
| 6,178,123 B1 * | 1/2001 | Kato et al. | 365/194 |
| 6,564,331 B1 | 5/2003 | Joshi | |
| 7,239,565 B2 | 7/2007 | Liu | |
| 7,558,104 B2 | 7/2009 | Sowden | |

* cited by examiner

*Primary Examiner* — Tuan T. Nguyen
(74) *Attorney, Agent, or Firm* — Lawrence J. Merkel; Meyertons, Hood, Kivlin, Kowert & Goetzel, P.C.; Stephen J. Curran

(57) ABSTRACT

A low power memory array column redundancy mechanism includes a memory unit having a memory array and a multiplexer unit. The memory array includes a plurality of columns, which includes a plurality of data columns and one or more unused columns. The multiplexer unit may selectively provide a constant value to the one or more unused columns of the memory array, and provide write data to the plurality of data columns during each write operation of the plurality of columns.

20 Claims, 4 Drawing Sheets

LOW POWER MEMORY ARRAY COLUMN REDUNDANCY MECHANISM

BACKGROUND

1. Technical Field

This disclosure relates to memory arrays and, more particularly, to column redundancy implementations.

2. Description of the Related Art

Many memory implementations use column redundancy to enable a memory array to be used even if the array has been manufactured with one or more bad bits or memory cells. Having a redundant column allows the array to be repaired. One conventional way to implement column redundancy uses a two to one multiplexer (mux). In such an implementation if a bit is bad, the mux may be used to simply shift a certain number of the bits to the next column from the bad column and to use the redundant column. However, in such conventional implementations, when a write occurs the redundant column gets written even when the redundant column isn't being used. Similarly, when the redundant column is being used to repair a bad column, the now bad/unused column may also continue to be written. This writing of data to the unused column causes toggling of the logic in the unused column, and since a column may include many bits considerable excess power may be consumed. In many applications, and particularly in mobile applications, excess power consumption may be unacceptable.

SUMMARY

Various embodiments of a low power memory array column redundancy mechanism are disclosed. Broadly speaking, in one embodiment, reducing power consumed by a memory array having redundant columns includes writing a constant value to the unused columns during each write operation of the array, thereby reducing the amount of unnecessary toggling in the array.

In one embodiment, a memory unit includes a memory array and a multiplexer unit. The memory array includes a plurality of columns, which includes a plurality of data columns and one or more unused columns. The multiplexer unit may selectively provide a constant value to the one or more unused columns of the memory array, and provide write data to the plurality of data columns during each write operation of the plurality of columns. In one particular implementation, the multiplexer unit may receive a repair selection encoding, and select which column is the unused column based upon the repair selection encoding.

Figure 1:
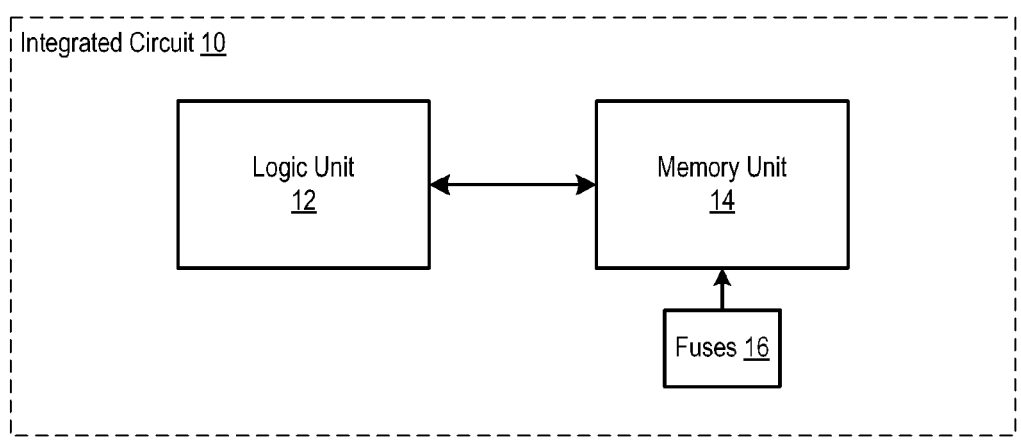
FIG. 1 is a block diagram of one embodiment of an integrated circuit.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

DETAILED DESCRIPTION

Turning now to FIG. 1, a block diagram of one embodiment of an integrated circuit 10 is shown. In the illustrated embodiment, the integrated circuit 10 includes a logic unit 12 coupled to a memory unit 14. In various embodiments, the memory unit may include any number of memory circuits, and likewise for the logic unit 12. It is noted that in one embodiment, the logic unit 12 and the memory unit 14 that implement the IC 10 may be manufactured on a single semiconductor substrate.

More particularly, the logic unit 12 may generally implement the operation for which the integrated circuit is designed. For example, the logic unit 12 may include processing logic, memory controller logic and the like. The memory unit 14 may implement any type of readable/writeable memory such as random access memory (RAM). For example, the memory unit 14 may include memory in the static RAM (SRAM) family of devices. Alternatively, the memory unit 14 may include memory in the dynamic RAM (DRAM) family of devices.

In one embodiment, the logic unit 12 may be configured to access the memory unit 14. Accordingly, the logic unit 12 may generate various control signals and/or values for accessing the memory unit 14. For example, the control signals may include an address identifying the memory location in the memory unit 14 that is to be accessed, a read enable signal which may be asserted to perform a read operation, and a write enable signal which may be asserted to perform a write operation. For a read operation, the memory unit 14 may output data to the logic unit 12. For a write operation, the logic unit 12 may supply data to the memory unit 14 for storage.

As mentioned above, memory unit 14 may be implemented as SRAM or DRAM, for example. As such, memory unit 14 may include one or more memory arrays (e.g., 210 of FIG. 2). For a variety of reasons, memory arrays experience bit failures during manufacturing. To mitigate some number of bit failures, as mentioned above, the array(s) within memory unit 14 are built with redundant or extra bits in the form of redundant columns. However, as described in greater detail below in conjunction with the descriptions of FIG. 2 and FIG. 3, to reduce power consumption in the array(s), multiplexers (e.g. 200 and 220 of FIG. 2) may be used at the input of the array for data write operations, and at the output of the array for data read operations. More particularly, in one embodiment based upon which fuses 16, if any, have been blown the multiplexer paths may be selected to shift write data to the remaining good columns (including the redundant column) and forcing a constant data value to the unused column.

Figure 2:
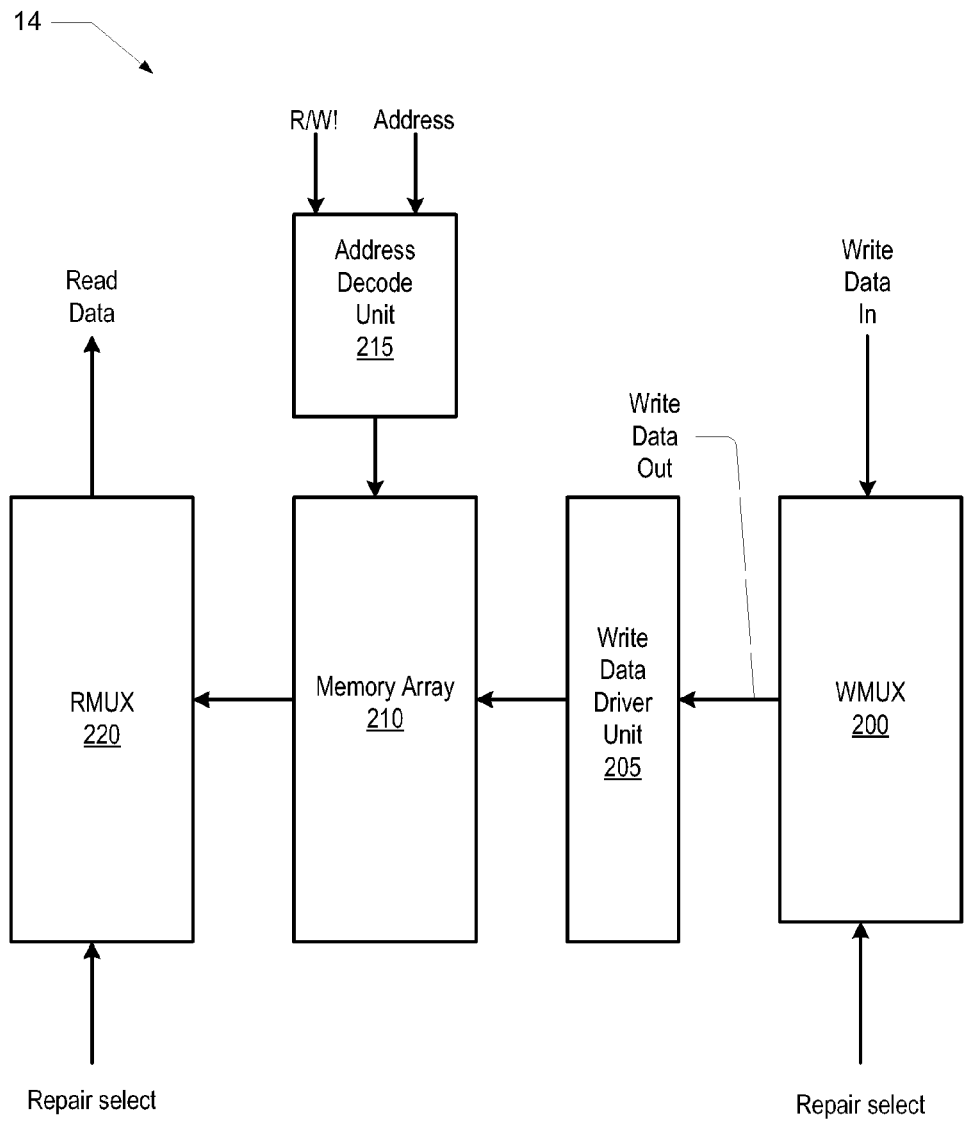
FIG. 2 is a block diagram of one embodiment of a memory circuit shown in FIG. 1.

Referring to FIG. 2, a block diagram of one embodiment of the memory unit 14 of FIG. 1 is shown. The memory unit 14 includes a write data input multiplexer (WMUX) 200, which is coupled to write data driver unit 205. The write data driver unit 205 is coupled to a memory array 210, which is turn coupled to a read data output mux (RMUX) 220. The memory array 210 is also coupled to an address decoder unit 215.

The address decoder 215 receives address information, and read and write signals (e.g., R/W! signal). The address decoder 215 may generate the signals necessary to read data from or write data to the memory array 210. In one embodiment, the address decoder 215 may include word line drivers that may be configured to generate word line signals based upon the address information. In addition, the address decoder 215 may also be configured to generate other control signals such as pre-charge, and read and write enable signals, for example.

In one embodiment, the memory array 210 may be an SRAM array. As such memory array may include memory cells (bits) arranged to form rows and columns. In addition, the memory array 210 may include global bit lines and local bit lines. Memory array 210 may also include bit line drivers and sense amps (both not shown). Generally, the bit lines may be used to transfer a bit into and out of a memory cell that is activated using the corresponding word line. The bit lines represent the bit differentially, with BL being the true value of the bit and BL bar being the complement of the bit. As described above, the memory array 210 is manufactured "extra" or redundant columns. These redundant columns are typically not used until a memory cell is found to be faulty during, for example, wafer probe. At that time, a redundant column that replaces the column with the bad bit may be activated.

In one embodiment, the WMUX 200 is configured to provide write data to the active columns of the memory array 210 and to drive a predetermined constant data value to the bits in the unused columns. More particularly, as described further below, in one embodiment, the WMUX 200 may be configured to route write data to the bits in the active columns dependent upon the repair select encodings shown in Table 1 below, which may be based on the fuses 16 that were blown during manufacture (e.g., wafer probe). In one embodiment, the fuses may be blown during wafer probe and subsequent to memory array testing during which failing bits may have been identified. Thus, in one embodiment, the WMUX 200 may be configured to multiplex the write data such that for a given byte, the column containing the bad bit is replaced with the bit from the redundant column. As described further below in conjunction with the description of FIG. 3, the WMUX 200 may effectively shift the write data bit positions away from the failed bit position and into the redundant bit position. For example, if bit 4 failed in a byte containing bits 0:7 plus a redundant bit 8, the WMUX 200 would stop using bit 4 and would shift the write data bits 4:7 to bits 5:8. Thus, bit positions 0:3 and 5:8 would contain write data, and bit position 4 would contain a constant value.

In one embodiment, the write data driver unit 205 may include driver circuits (not shown) that may drive the write data to the appropriate level to be stored within the memory array 210. In one embodiment, as described further below the write data paths output by WMUX 200 may be assertion low signals. As such, when a data value of one is written the data driver or other circuitry within the memory array 210 may invert that value and cause a logical value of zero to be stored within the corresponding memory cell.

The RMUX 220 is configured to provide read data from the memory array 210 during a read operation. In one embodiment, depending on the repair select encodings, the RMUX 220 may be configured to demultiplex or unshift the data from the memory array 210, which may have been shifted due to repaired columns. More particularly, as described further below, in one embodiment, the RMUX 220 may include circuitry similar to that included in the WMUX 200.

Figure 3:
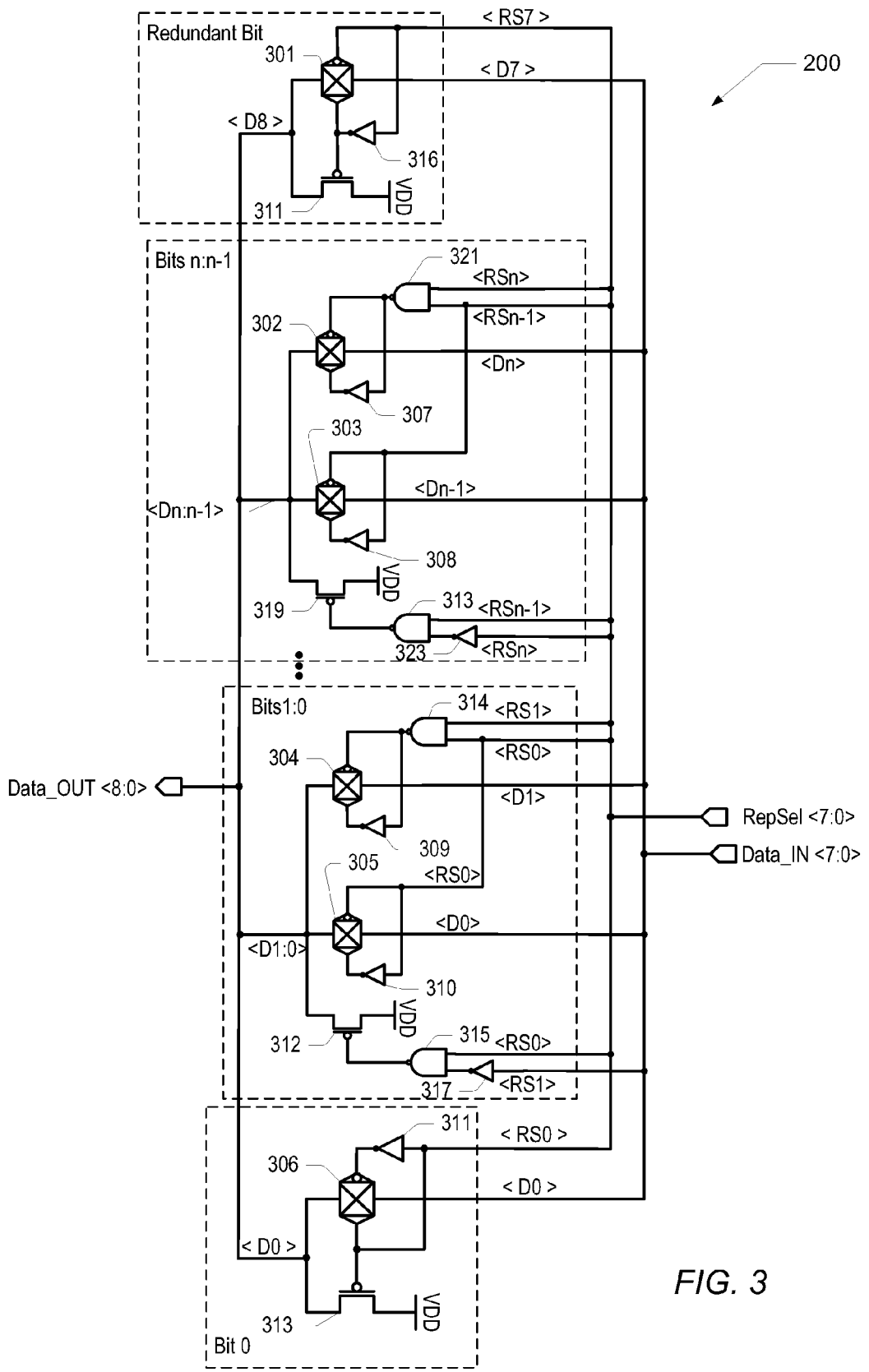
FIG. 3 is a circuit diagram of one embodiment of a write data multiplexer of FIG. 2.

Turning to FIG. 3, a circuit diagram of one embodiment of the WMUX 200 of FIG. 2 is shown. The WMUX 200 is coupled to receive a byte of write data on the Data_IN <7:0> data path, and to provide eight bits of data (e.g., a byte plus the redundant bit/unused data bit) on the Data_OUT <8:0> data path. In addition, the WMUX 200 is coupled to receive the repair select encoding signals via the RepSel <7:0> signal paths, which are used to select the appropriate data paths to repair a bad bit. The repair select encodings are shown in Table 1, below.

In the illustrated embodiment, although the WMUX 200 includes nine possible output data paths (e.g., <D8:0>) for the eight data bits (e.g., Data_IN <7:0 >), only a few of the data paths are shown for simplicity. More particularly, the logic for bit zero, the logic for the redundant bit, the logic for bits one and zero, and the logic for the general case (e.g., Dn:Dn−1) is shown. If the logic for all bits of one byte were shown, there would be logic for bit 0, bits 1:0, bits 2:1, bits 3:2, bits 4:3, bits 5:4, bits 6:5, bits 7:6, and the redundant bit. As shown, the redundant bit logic is in the dashed line box at the top, while the data bit zero logic is at the bottom. Above the bit zero logic is a box that includes the bits one and zero logic, and above that is a box that includes the logic representing the general case of bits n and n−1.

The bit zero logic includes a transmission or "pass" gate 306 which is coupled to receive the write data bit zero (D0) and to provide the write data D0 when the transmission gate 306 is conducting (i.e., it is on). It is noted that as shown the pass gates include an N-type metal oxide semiconductor (NMOS) transistor coupled in parallel with a P-type MOS (PMOS) transistor. The bit zero logic also includes an inverter 311 which is coupled to the P-MOS side of the pass gate 306, and a P-MOS transistor 313. As shown, the repair select bit zero (RS0) is coupled to the input of the inverter and to the NMOS side of the pass gate 306. Accordingly, the RS0 signal turns the pass gate 306 on and off. In addition, the RS0 signal turns the transistor 313 on and off, which may provide supply voltage (VDD) to the D0 output when conducting. Accordingly, the bit zero logic implements a two-to-one mux, supplying either data bit D0 or a logic value of one depending on the value of the repair select signal RS0.

The redundancy bit logic includes a pass gate 301 coupled to receive data bit seven (D7) and provide the data bit as data bit eight (D8), when it is conducting. The redundancy bit logic also includes an inverter 316 and a PMOS transistor 311. The redundancy bit logic is similar to the bit zero logic except, as shown, a logic value of zero on RS7 turns on the pass gate 301 and transistor 311, while a logic value of one on RS0 turns on pass gate 306 and transistor 313. Thus, the redundancy bit logic also implements a two-to-one mux, supplying either data bit D7 or a logic value of one depending on the repair select signal RS7 value.

The bit one and zero logic includes a pass gate 304, which is coupled to pass the data bit (D1) when conducting, and a pass gate 305 which is coupled to pass the data bit D0 when conducting. The bit one and zero logic also includes a PMOS transistor 312. Thus, the bit one and zero logic may implement a three-to-one mux that may supply one of data bit D1, data bit D0, or VDD depending upon the encoding of the repair select signals RS1 and RS0. As shown, to control the operation of the pass gates 304 and 305, and the transistor 312, the bit one and zero logic also includes a NAND gate 314 that is coupled to the PMOS side of the pass gate 304 and to the NMOS side of pass gate 304 through inverter 309. In addition, NAND gate 315 and inverter 317 are coupled to and control transistor 312.

The bits n and n−1 logic includes a pass gate 302, which is coupled to pass the data bit (Dn) when conducting, and a pass gate 303 which is coupled to pass the data bit Dn−1 when conducting. The bits n and n−1 logic also includes a PMOS transistor 319. Thus, the bits n and n−1 logic may also implement a three-to-one mux that may supply one of data bit Dn, data bit Dn−1, or VDD depending upon the encoding of the repair select signals RSn and RSn−1. As shown, to control the operation of the pass gates 302 and 303, and the transistor 319, the bits n and n−1 logic also includes a NAND gate 321 that is coupled to the PMOS side of the pass gate 302 and to the NMOS side of pass gate 302 through inverter 307. In addition, NAND gate 313 and inverter 323 are coupled to and control transistor 312.

It is noted that although the embodiment shown in FIG. 3 illustrates one byte of data being input to WMUX 200, it is contemplated that in other embodiments, other numbers of bytes, and/or other numbers of bits may be used. For example, the data path may be implemented using 32 bits, broken up into four bytes, and therefore having four redundant columns.

As mentioned above, if there is a failed bit or bits in the memory array 210, the redundant columns may be used to repair the array. Accordingly, in one embodiment, the fuses 16 may be blown to permanently cause a particular encoding to be provided during or at power up of the integrated circuit. However, it is noted that in other embodiments, it is contemplated that the repair selection encodings may be provided dynamically from, for example, a built-in self-test (BIST) unit (not shown) within the integrated circuit 10.

In either case, the repair select encoding may be provided to WMUX 200 to select which, if any, bits (columns) will be repaired. More particularly, one such exemplary encoding scheme is shown in Table 1. It is noted that in other embodiments, other encodings may be possible and are thus contemplated. As shown in Table 1, the repair select encoding is shown as an eight-bit value. For example, if there are no failed bits and thus no columns to repair an encoding of 11111111b as shown in row 2 of Table 1, would be used. Similarly, if bit 0 and thus column 0 were to be repaired, an encoding of 00000000b would be used, and so on, according to Table 1.

TABLE 1

| Column repair mux select encodings | | | | | | | | |
|---|---|---|---|---|---|---|---|---|
| RS7 | RS6 | RS5 | RS4 | RS3 | RS2 | RS1 | RS0 | Column Repair |
| 1 | 1 | 1 | 1 | 1 | 1 | 1 | 1 | No Repair |
| 0 | 1 | 1 | 1 | 1 | 1 | 1 | 1 | Repair 7 |
| 0 | 0 | 1 | 1 | 1 | 1 | 1 | 1 | Repair 6 |
| 0 | 0 | 0 | 1 | 1 | 1 | 1 | 1 | Repair 5 |
| 0 | 0 | 0 | 0 | 1 | 1 | 1 | 1 | Repair 4 |
| 0 | 0 | 0 | 0 | 0 | 1 | 1 | 1 | Repair 3 |
| 0 | 0 | 0 | 0 | 0 | 0 | 1 | 1 | Repair 2 |

TABLE 1-continued

| Column repair mux select encodings | | | | | | | | |
|---|---|---|---|---|---|---|---|---|
| RS7 | RS6 | RS5 | RS4 | RS3 | RS2 | RS1 | RS0 | Column Repair |
| 0 | 0 | 0 | 0 | 0 | 0 | 0 | 1 | Repair 1 |
| 0 | 0 | 0 | 0 | 0 | 0 | 0 | 0 | Repair 0 |

Referring back to FIG. 3, exemplary operation of WMUX 200 is described when there are no failed bits and thus no repair necessary. Accordingly, with an encoding of 11111111b, the redundant bit logic pass gate 301 is off because RS7 is at a logic value of one. In addition, the transistor 311 is conducting and providing a logic value of one as the D8 data. Thus the Data_OUT <D8:0> data path would have actual write data in D7:0 and logic value of one in D8. Accordingly, each time write data is provided to WMUX 200 and the data is written into memory array 210, the data bit D8 does not change and therefore does not toggle any corresponding logic gates. Accordingly, in an array that includes many bits per column, and many redundant columns for the entire array, a significant power savings may be realized by not toggling the unused bit logic.

In another example, if bit zero and therefore column zero failed, an encoding of 00000000b would be used. In this case, the bit zero pass gate 306 is off and transistor 313 is on due to RS0 being at a logic value of zero. Thus data path bit position D0 is driven to a logic value of one. The encoding of 00000000b forces the WMUX 200 to shift all the data up one bit position and to begin using the redundant bit. More particularly, the pass gate 305 is on and pass gate 304 is off, and the transistor 312 is off due to RS1 and RS0 being at a logic value of zero. Accordingly, data bit D0 is now passed through pass gate 305 and into the bit position of D1. The data bit D1 is pushed (shifted) up to the next bit logic, and so on up the data path. In the redundant bit logic, the pass gate 301 is on and transistor 311 is now off due to RS7 being at a logic value of zero. The Data_OUT <D8:0> data path would have bit position D0 at a logic value of one, and write data in positions D8:1.

In yet another example, if bit one and thus column one failed, an encoding of 00000001b would be used. In this case, the bit zero pass gate 306 is on and transistor 313 is off due to RS0 being at a logic value of one. Thus, data bit D0 is provided by pass gate 306 to data bit position D0. However, since bit D1 and thus column one has failed, the data D1:D7 needs to be shifted up. Accordingly, pass gate 305 is now off, pass gate 304 is also off, and the data bit D1 is shifted up to the next bit logic. In addition, transistor 315 is now on, thus driving VDD onto the data path for the D1 bit position. Similar to the above example, in the redundant bit logic, the pass gate 301 is on and transistor 311 is now off due to RS7 being at a logic value of zero. The Data_OUT <D8:0> data path would have write data in bit position D0, a logic value of one in bit position D1, and write data in bit positions D8:2.

In one embodiment, the Data_OUT signal path may be an assertion low signal path. Accordingly, when the data is actually written into the memory array, the data may be inverted so that, for example, when the actual data has a value of one, the logical value that is written is a zero. In addition, in one embodiment, the memory array may implement a global bit line associated with the output of each column. In such an embodiment, when a logic value of zero is stored in the memory cells of a column, the global bit line may stay charged when a read operation is performed. Thus, by forcing the unused column bits to a predetermined logic value, additional power may be saved when the data is read back out of the memory. More particularly, if the global bit line for a given unused column in the array can remain charged each time it is read, power may be saved by not having to re-charge the bit line. Similarly, in other embodiments, only one local bit line may be used to read a memory cell. In such embodiments, the local bit lines may also be prevented from toggling unnecessarily in an unused column when a predetermined value is written into the cells of the unused column, which allows the bit line to stay charged. Accordingly, by storing a logic zero in the memory cells (bits) of the unused columns, power may be saved.

When the data is read back out of the memory array, the data must be de-multiplexed. Thus, as mentioned above, RMUX 220 may include logic similar to WMUX 200 in which the same encodings may be used to enable RMUX 220 to put the multiplexed data onto the correct data bit positions.

It is noted that the above encodings shown in Table 1 match the logic shown in FIG. 3. However, it is contemplated that in other embodiments, other logic may be used to have similar functionality. As such different encodings would be used for such logic.

It is also noted that although the above embodiments have been shown and described such that particular logic components have been used. However, it is contemplated that in other embodiments, complimentary logic may be used. In such alternative embodiments, the logic values used in the repair selection encodings would be different. Similarly, the constant value written to the unused columns would be reversed.

Figure 4:
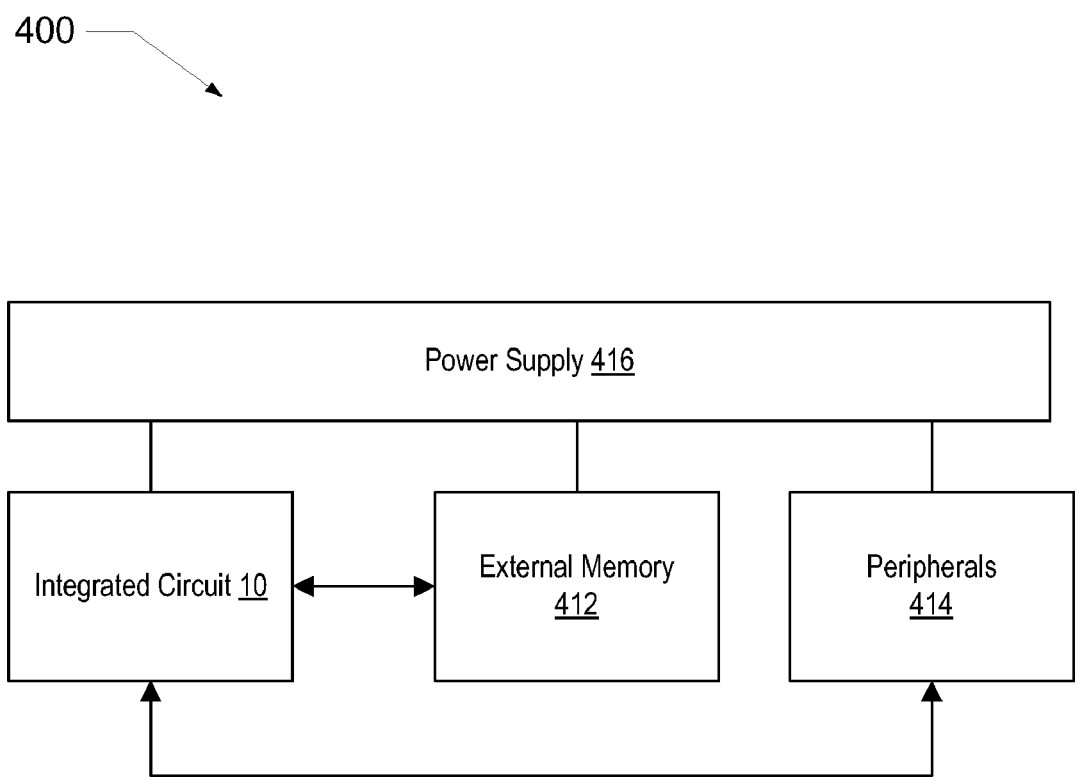
FIG. 4 is a block diagram of one embodiment of a system including the integrated circuit of FIG. 1.

In an alternative embodiment, the WMUX 200 may be implemented using a two-to-one mux for each column, rather than a three-to-one mux. In such an embodiment, shifting the bits up one bit to repair a given bit would still be implemented. However, instead of using a three-to-one mux with a pullup transistor being one of the mux paths to force a constant value on an unused column, a two-to-one mux may be used. The two mux paths may be used to select between data bits and additional logic such as AND-ing or OR-ing (or their compliments) circuitry may be placed in the data path of each column As such, when a given column is unused, an appropriate repair select signal may be force the data value to the constant value. For example, to force a logic value of one on an unused column, a two input OR-ing function may be used in which one input is coupled to the repair select signal Referring to FIG. 4, a block diagram of one embodiment of a system 400 including the integrated circuit 10 is shown. The system 400 includes at least one instance of the integrated circuit 10 of FIG. 1 coupled to one or more peripherals 414 and an external memory 412. The system 400 also includes a power supply 416 that may provide one or more supply voltages to the integrated circuit 10 as well as one or more supply voltages to the memory 412 and/or the peripherals 414. In some embodiments, more than one instance of the integrated circuit 10 may be included.

The external memory 412 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 414 may include any desired circuitry, depending on the type of system 110. For example, in one embodiment, the system 400 may be a mobile device and the peripherals 414 may include devices for various types of wireless communication, such as WiFi, Bluetooth, cellular, global position system, etc. The peripherals 414 may also include additional storage, including RAM storage, solid-state storage, or disk storage. The peripherals 414 may include user interface devices such as a display screen, including touch display screens or multi-touch display screens, keyboard or other keys, microphones, speakers, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory unit comprising:
   a memory array including a plurality of columns, wherein the plurality of columns includes a plurality of data columns and one or more unused columns; and
   a multiplexer unit coupled to the memory array and configured to selectively provide a constant value to the one or more unused columns of the memory array, and to provide write data to the plurality of data columns during each write operation of the plurality of columns.

2. The memory unit as recited in claim 1, wherein the multiplexer unit is configured to receive a repair selection encoding, and to select which column of the plurality of columns is the one or more unused columns based upon the repair selection encoding.

3. The memory unit as recited in claim 2, wherein the repair selection encoding corresponds to a value generated according to fuses blown during manufacturing of the memory unit.

4. The memory unit as recited in claim 1, wherein the multiplexer unit is configured to provide the constant value to an unused column that comprises a redundant column in response to no columns of the plurality of columns being faulty.

5. The memory unit as recited in claim 1, wherein in response to a bit of a given column of the plurality of data columns being faulty, the multiplexer unit is configured to provide the constant value to the given column and to provide the write data to the remaining columns of the plurality of data columns and to the column of the one or more unused columns.

6. A method comprising:
   during each write operation to a memory array having a plurality of columns, wherein the plurality of columns includes a plurality of data columns and one or more unused columns, writing a constant value to the one or more unused columns of the memory array and writing write data corresponding to a write operation of the plurality of data columns.

7. The method as recited in claim 6, further comprising selecting which of the plurality of columns corresponds to a column of the one or more unused columns based upon a repair selection encoding.

8. The method as recited in claim 7, further comprising generating the repair selection encoding based upon bit failures detected during manufacturing of the memory array.

9. The method as recited in claim 6, further comprising in response to a bit of a given column of the plurality of data columns being faulty, writing the constant value to the given column and writing the write data to the remaining columns of the plurality of data columns and to the column of the one or more unused columns.

10. An integrated circuit comprising:
    a logic unit; and
    a memory unit coupled to the logic unit, wherein the memory unit includes:

a memory array including a plurality of columns, wherein the plurality of columns includes a plurality of data columns and one or more unused columns; and a multiplexer unit configured to selectively provide, to the memory array, a constant value to the one or more unused columns of the memory array, and to provide write data to the plurality of data columns during a write operation of the plurality of columns.

11. The integrated circuit as recited in claim 10, wherein the multiplexer unit is configured to receive a repair selection encoding, and to select which column of the plurality of columns is the one or more unused columns based upon the repair selection encoding.

12. The integrated circuit as recited in claim 11, wherein the multiplexer unit includes a plurality of multiplexers including:

a first two-to-one multiplexer configured to provide one of the constant value, or write data corresponding to data bit position zero dependent upon the repair selection encoding;

a plurality of three-to-one multiplexers, each configured to provide one of the constant value, write data corresponding to a data bit position n, or write data corresponding to a data bit position n−1 dependent upon the repair selection encoding, where n is any whole number greater than zero; and a second two-to-one multiplexer configured to provide one of the constant value, or write data corresponding to a data bit position n dependent upon the repair selection encoding.

13. The integrated circuit as recited in claim 12, wherein for a given bit position being repaired, the multiplexer corresponding to the given bit position is configured to provide the constant value, and wherein the multiplexer for a next higher numbered bit position is configured to provide the write data for the bit position being repaired.

14. A memory comprising:

a memory array including a plurality of columns, wherein the plurality of columns includes a plurality of data columns and a redundant column; and a multiplexer unit configured to provide a constant value to the redundant column, and write data to the plurality of data columns during each write operation of the plurality of columns in which the redundant column is unused.

15. The memory as recited in claim 14, wherein the multiplexer unit is further configured to provide the constant value to one data column of the plurality of data columns, and write data to the remaining columns of plurality of columns during each write operation of the plurality of columns in which the redundant column is used as a data column.

16. The memory as recited in claim 15, wherein the multiplexer unit is configured to receive a repair selection encoding, and to use the redundant column as a data column dependent upon the repair selection encoding.

17. The memory as recited in claim 14, wherein the constant value comprises a logic value of one.

18. The memory as recited in claim 14, wherein the constant value comprises a logic value of zero.

19. A method comprising:

during each write operation to a memory array having a plurality of columns, wherein the plurality of columns includes a plurality of data columns and a redundant column, providing a constant value to the redundant column and write data to the plurality of data columns during each write operation of the plurality of columns in which the redundant column is unused; and providing the constant value to one data column of the plurality of data columns, and write data to the remaining columns of plurality of columns during each write operation of the plurality of columns in which the redundant column is used as a data column.

20. The system as recited in claim 19, further comprising using the redundant column as a data column dependent upon a received repair selection encoding.

* * * * *